United States Patent
Hao et al.

(10) Patent No.: US 9,215,831 B2
(45) Date of Patent: Dec. 15, 2015

(54) HEAT DISSIPATION SYSTEM

(71) Applicant: Huawei Technologies Co., Ltd., Shenzhen, Guangdong (CN)

(72) Inventors: Mingliang Hao, Shenzhen (CN); Yuan Dong, Shenzhen (CN); Lei Bai, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 236 days.

(21) Appl. No.: 14/103,504

(22) Filed: Dec. 11, 2013

(65) Prior Publication Data

US 2014/0138069 A1    May 22, 2014

Related U.S. Application Data

(63) Continuation of application No. PCT/CN2013/074880, filed on Apr. 27, 2013.

(30) Foreign Application Priority Data

Nov. 22, 2012   (CN) .......................... 2012 1 0476924

(51) Int. Cl.
*H05K 7/20* (2006.01)
*G06F 1/20* (2006.01)

(52) U.S. Cl.
CPC .............. *H05K 7/20554* (2013.01); *G06F 1/20* (2013.01); *H05K 7/20* (2013.01); *H05K 7/20563* (2013.01); *H05K 7/20572* (2013.01); *H05K 7/20736* (2013.01)

(58) Field of Classification Search
CPC . H05K 7/20; H05K 7/20554; H05K 7/20563; H05K 7/20572; H05K 7/20781; H05K 7/20736; H05K 5/00; G06F 1/20; G06F 1/184; F28D 15/00

USPC ....................... 361/679.46–679.51, 690–697, 361/715–727; 165/80.2–80.5, 104.33, 165/121–126, 185; 454/184; 312/223.2, 312/236, 265

See application file for complete search history.

(56) References Cited

U.S. PATENT DOCUMENTS 6,341,064 B1 *   1/2002   Bradley ................. H02B 1/565
                                                                    361/695
7,280,356 B2 *  10/2007   Pfahnl ................ H05K 7/20563
                                                                    361/690

(Continued)

FOREIGN PATENT DOCUMENTS

CN          1975919 A       6/2007
CN        201115199 Y       9/2008

(Continued)

*Primary Examiner* — Michail V Datskovskiy

(57) ABSTRACT

The present invention relates to a heat dissipation system. The heat dissipation system includes: a chassis, configured to house single boards of an orthogonal architecture, where the single boards includes a vertically inserted board; a first fan group, installed inside a first air intake pipe in the upper front of the chassis and configured to guide air into the chassis; and an air guide cavity, installed inside the chassis and configured to transfer the air that is guided by the first fan group into the chassis to a component on the vertically inserted board to perform heat dissipation. With the heat dissipation system in embodiments of the present invention, air is separately supplied to a heat dissipation component on a vertically inserted board in a communications system device based on an orthogonal architecture.

15 Claims, 9 Drawing Sheets

(56) References Cited

U.S. PATENT DOCUMENTS

| | | | |
|---|---|---|---|
| 7,411,787 B2 | 8/2008 | Katakura et al. | |
| 7,688,593 B2 * | 3/2010 | Byers | H05K 7/20572 165/104.33 |
| 7,766,733 B2 * | 8/2010 | Kasahara | G06F 1/20 361/679.48 |
| 7,965,504 B2 * | 6/2011 | Hamlin | H05K 7/20572 165/80.2 |
| 8,064,200 B1 * | 11/2011 | West | H05K 7/20563 361/694 |
| 8,120,912 B2 | 2/2012 | Aybay et al. | |
| 8,830,674 B2 * | 9/2014 | Qu | G06F 1/20 361/679.49 |
| 8,854,814 B2 * | 10/2014 | Liu | H05K 7/20736 361/695 |
| 8,908,372 B1 * | 12/2014 | West | H05K 7/20563 361/694 |
| 2005/0002080 A1 * | 1/2005 | Nakaho | G02F 1/157 359/265 |
| 2006/0126292 A1 | 6/2006 | Pfahnl et al. | |
| 2007/0133168 A1 * | 6/2007 | Shabany | H05K 7/20581 361/695 |
| 2010/0159816 A1 | 6/2010 | Huels et al. | |
| 2012/0327597 A1 * | 12/2012 | Liu | H05K 7/20736 361/692 |

FOREIGN PATENT DOCUMENTS

| | | |
|---|---|---|
| CN | 101621913 A | 1/2010 |
| CN | 101790300 A | 7/2010 |
| EP | 2 141 974 A2 | 1/2010 |

* cited by examiner

HEAT DISSIPATION SYSTEM

CROSS-REFERENCE TO RELATED APPLICATIONS

This application is a continuation of International Application No. PCT/CN2013/074880, filed on Apr. 27, 2013, which claims priority to Chinese Patent Application No. 201210476924.X, filed on Nov. 22, 2012, both of which are hereby incorporated by reference in their entireties.

TECHNICAL FIELD

The present invention relates to the field of communications devices, and in particular to a heat dissipation system having a U-shaped or π-shaped air duct and based on an orthogonal architecture of single boards.

BACKGROUND

An orthogonal architecture is a kind of connection structure popularly used in a current communications system to connect a main control component and several functional components. Such orthogonal architecture of single boards may be implemented by using a single board arrangement manner of vertically inserting a front board and horizontally inserting a rear board, or horizontally inserting a front board and vertically inserting a rear board. In the foregoing implementation manner, a heat dissipation system generally uses design of a Z-shaped air duct. By taking a manner of horizontally inserting a front board and vertically inserting a rear board as an example, as shown in FIG. 1, single boards include a front board 11 and a rear board 12, which are respectively inserted on two sides of a backplane 14 in a chassis 10. The front board 11 is horizontally inserted, and the rear board 12 is vertically inserted. When the system works, a fan 15 blows air outward so as to drive air from an air intake vent 13 at a bottom of the chassis 10 to enter the chassis 10. In a direction indicated by arrows shown in FIG. 1, air passes through heating components 121, 122, and 123 on the rear board 12, then passes through heating components 124, 125, and 126, and is blown outward by the fan. In this way, temperature concatenation between an upper component and a lower component on the rear board is formed, thereby directly affecting a heat dissipation effect of the heating components 124, 125, and 126 close to a top. In addition, because the system uses design in which air enters from the bottom and exits from the top, a 4U air intake vent space and a 4U air outlet space need to be reserved, thereby occupying a relatively large space area.

SUMMARY

A first objective of the present invention is to solve a problem in the prior art that a heat dissipation effect is poor due to temperature concatenation between an upper component and a lower component on a vertically inserted board in a heat dissipating process.

A second objective of the present invention is to solve a problem in the prior art that a heat dissipation system occupies a large space.

According to a first aspect, the present invention provides a heat dissipation system, including:

a chassis, configured to house single boards of an orthogonal architecture, where the single boards includes a vertically inserted board;

a first fan group, installed inside a first air intake pipe in the upper front of the chassis and configured to guide air into the chassis; and an air guide cavity, installed inside the chassis and configured to transfer the air that is guided by the first fan group into the chassis to a component on the vertically inserted board to perform heat dissipation.

According to a second aspect, the present invention provides a heat dissipation system, including:

a chassis, configured to house single boards of an orthogonal architecture, where the single boards includes at least a first vertically inserted board and a second vertically inserted board that are stacked;

a third air intake pipe and a fourth air intake pipe, where the third air intake pipe is located above the first vertically inserted board, and the fourth air intake pipe is located below the second vertically inserted board, so that air enters the chassis after passing through the third air intake pipe and the fourth air intake pipe;

an air outlet, disposed in the middle rear of the chassis and configured to discharge air inside the chassis; and a fan group, installed inside the third air intake pipe and the fourth air intake pipe, and/or the air outlet, and configured to absorb air from the third air intake pipe and the fourth air intake pipe and/or discharge air from the air outlet.

An arrangement structure of the third air intake pipe, the fourth air intake pipe, the first vertically inserted board, and the second vertically inserted board, matched with the air outlet, enables air in the third air intake pipe and the fourth air intake pipe to respectively pass through the first vertically inserted board and the second vertically inserted board and then to be discharged by the air outlet.

By applying the heat dissipation system provided in embodiments of the present invention, air is separately supplied to a heat dissipation component on a vertically inserted board in a communications device based on an orthogonal architecture, thereby breaking through temperature concatenation between an upper component and a lower component, and at the same time, saving a heat dissipation space and improving a heat dissipation capability of the system.

DETAILED DESCRIPTION

The technical solutions of the present invention are described in further detail in the following with reference to the accompanying drawings and embodiments.

With a heat dissipation system provided in an embodiment of the present invention, an air ducting apparatus is used to separately supply air to each of heating components serially connected on a vertically inserted board in a communications device based on an orthogonal architecture, thereby breaking through temperature concatenation between an upper component and a lower component. In addition, a heat dissipation capability of the vertically inserted board is improved and a height of the heat dissipation system is reduced by using a U-shaped air duct structure, or a better heat dissipation effect is achieved by using a π-shaped air duct structure.

To facilitate description, in the accompanying drawings of the following embodiments, a left side is defined as a front side of a chassis, a right side is a rear side of the chassis, a front-view direction in each schematic diagram is a left-side direction of the chassis, and all schematic diagrams are sectional views. In the following description, each embodiment and each schematic diagram are described according to directions defined herein, which are not described again.

Figure 1:
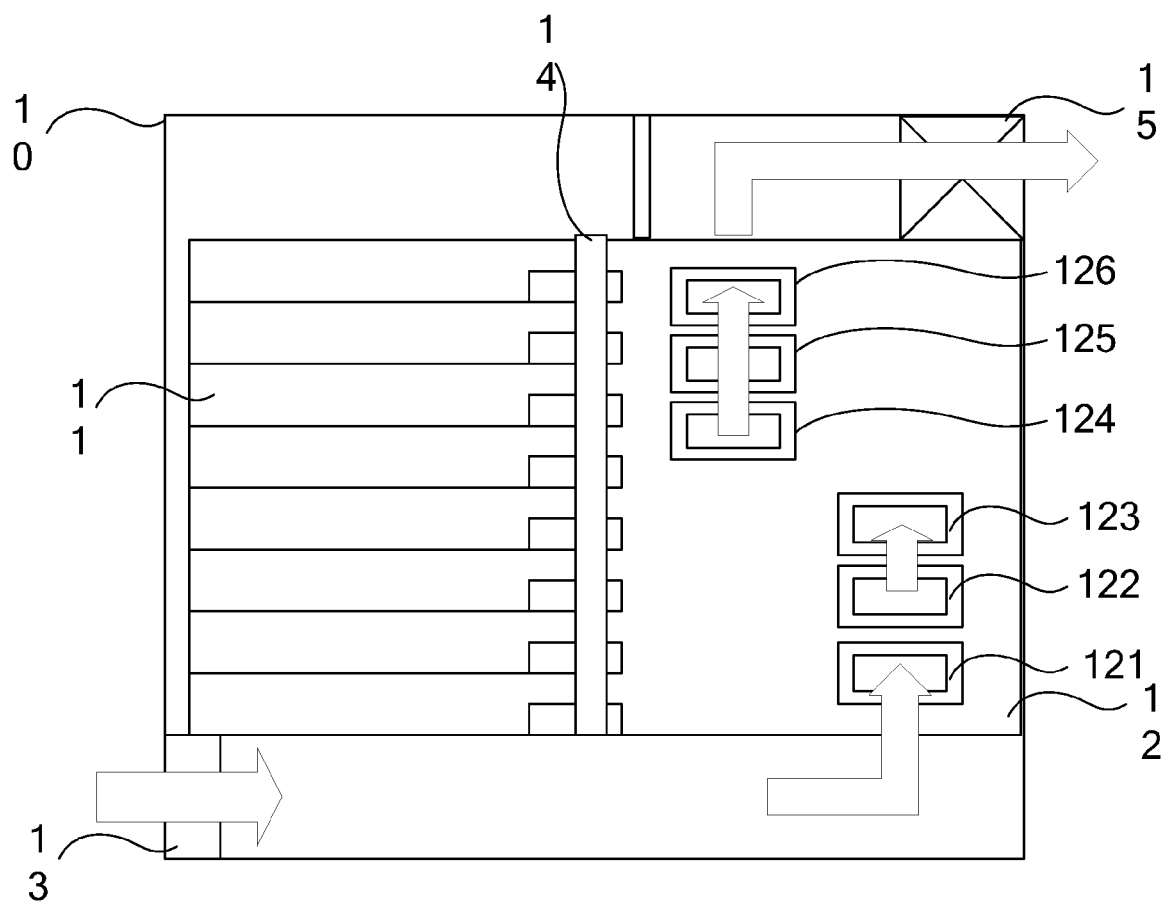
FIG. 1 is a schematic structural diagram of a heat dissipation system with a Z-shaped air duct in the prior art.
Figure 2:
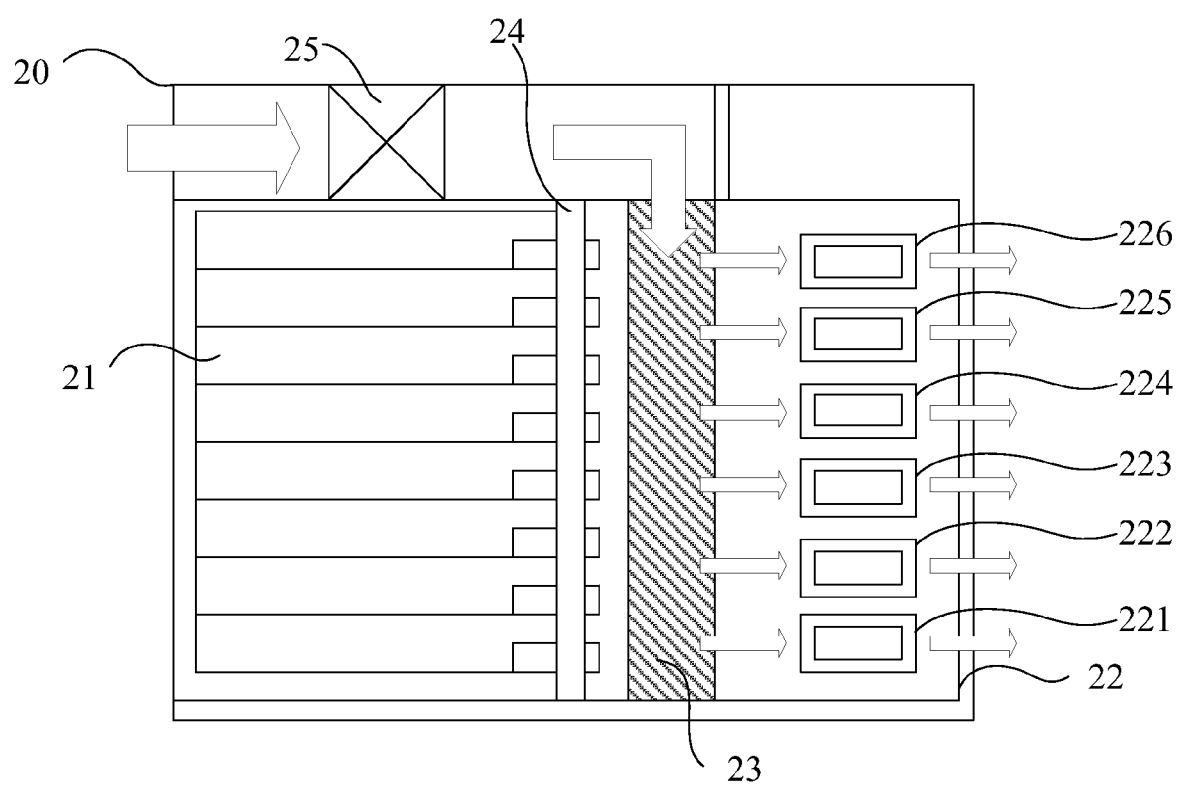
FIG. 2 is a side view of a sectional structure of a heat dissipation system with a U-shaped air duct according to a first embodiment of the present invention.

FIG. 2 is a side view of a sectional structure of a heat dissipation system with a U-shaped air duct according to a first embodiment of the present invention. As shown in FIG. 2, the heat dissipation system in the first embodiment includes: a chassis 20, an air guide cavity 23, and a first fan group 25.

The chassis 20 is of a rectangular structure. A first air intake pipe in which the first fan group 25 is installed is reserved at a front top of the chassis 20, and multiple cooling holes (not shown in the figure; and reference is made to arrows shown on a rear side of the chassis) may exist on the rear side of the chassis 20. A horizontally inserted board 21 and a vertically inserted board 22 are disposed inside the chassis 20, and are inserted with each other through a backplane 24 or directly inserted with each other to form an orthogonal architecture.

Figure 2A:
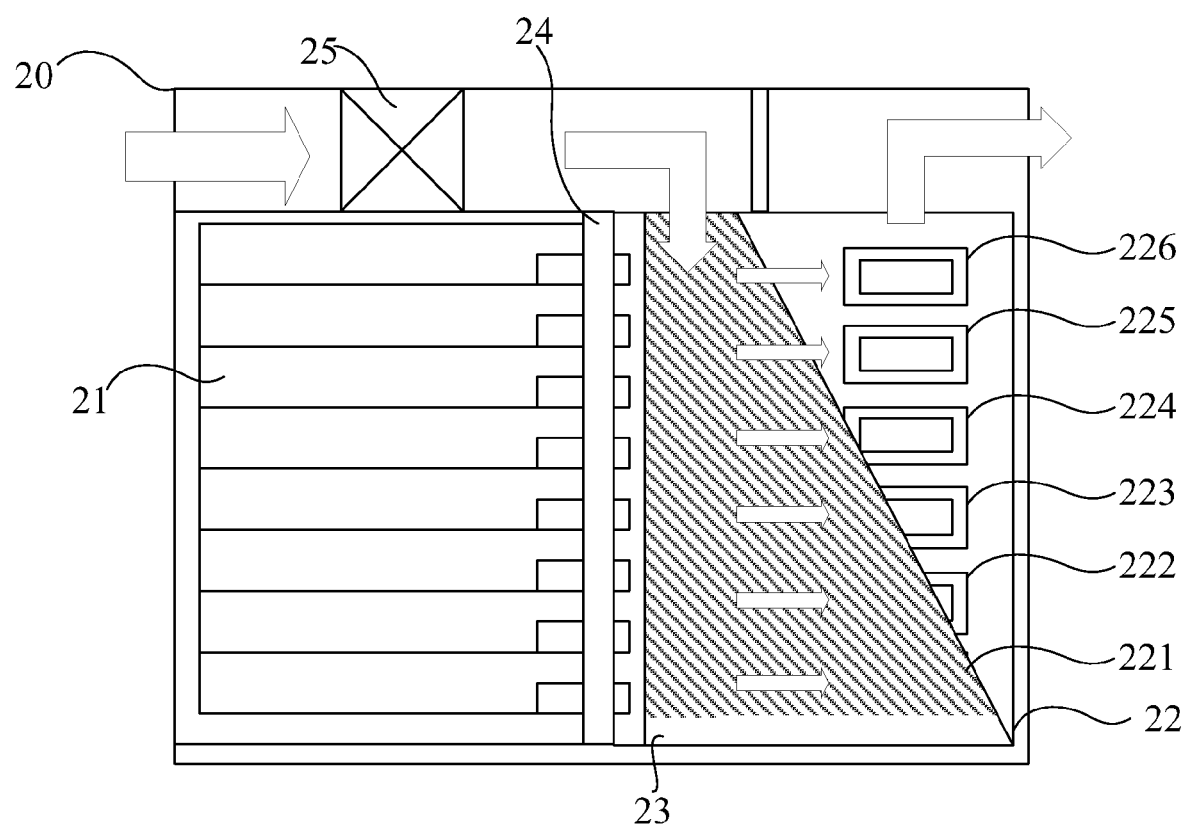
FIG. 2a is a first variant of the heat dissipation system shown in FIG. 2.

The air guide cavity 23 is disposed between two vertically inserted boards 22, and may be installed on a framework of the chassis 20 or installed on the vertically inserted board 22. An opening on a top of the air guide cavity 23 is connected to the first air intake pipe in which the first fan group 25 is installed. A shape of the air guide cavity 23 may be a column, a terrace, or a customized irregular shape. In an example, as shown in FIG. 2, the air guide cavity 23 is of a columnar structure, and multiple side-wall holes (not shown in the figure; and reference may be made to positions of arrows of the air guide cavity pointing to the vertically inserted board) that are toward a rear direction of the chassis exist on a side wall. In another example, as shown in FIG. 2a, the air guide cavity 23 is of a terrace structure, its four sides: front, rear, top, and bottom are rectangles; its two sides: left and right are trapezoids; multiple side-wall holes that are toward a rear direction of the chassis exist on a side wall of the air guide cavity 23; and in addition, multiple wall holes that are directly toward heating components of a rear board may further exist, so that it is convenient to directly supply air to the heating components, thereby enhancing a heat dissipation effect.

When the heat dissipation system works, the first fan group 25 drives air from outside the chassis 20, so that the air is absorbed into the chassis 20 through the first fan group 25, passes through the first air intake pipe, and enters the air guide cavity 23. The air is directly blown through the multiple side-wall holes of the air guide cavity 23 towards heating components 221 to 226 on the vertically inserted board 22, so that the air is separately supplied to each heating component to facilitate heat dissipation of the component. Then the air is discharged from the cooling holes (not shown in the figure; and reference is made to the arrows shown on the rear side of the chassis) on the rear side of the chassis 20. The foregoing air duct through which a cooling air flow passes is of a U-shaped structure. If the cooling holes on the rear side of the chassis 20 are insufficient or cannot be drilled or an air discharge volume needs to be increased, as shown in FIG. 2a and FIG. 2b, an air duct on a top of the chassis may further be utilized to discharge air out of the chassis, thereby increasing the air discharge volume.

An air discharge volume and air discharge direction of a side-wall hole on the air guide cavity 23 may be controlled by an air volume management apparatus (not shown in the figure). Multiple specific implementation manners of the air volume management apparatus may exist. For example, side-wall holes of different hole diameters or different hole quantities are disposed; or an air discharge volume is controlled by using an air volume regulating valve and controlling an opening size and an angle of the regulating valve.

In a case that a volume of air entering the air guide cavity 23 is sufficient, pressure inside the air guide cavity 23 is relatively high, and without being affected by air discharge loss, the air guide cavity 23 forms a pressure-equalized cavity. In a case that hole diameters of various air discharge holes are the same, air discharge volumes of the air discharge holes are also the same. In this case, in combination with the air volume management apparatus, different air discharge volumes may be provided conveniently according to different amounts of heat generated by various heating components, so that air is separately supplied to each component to perform heat dissipation.

Figure 2B:
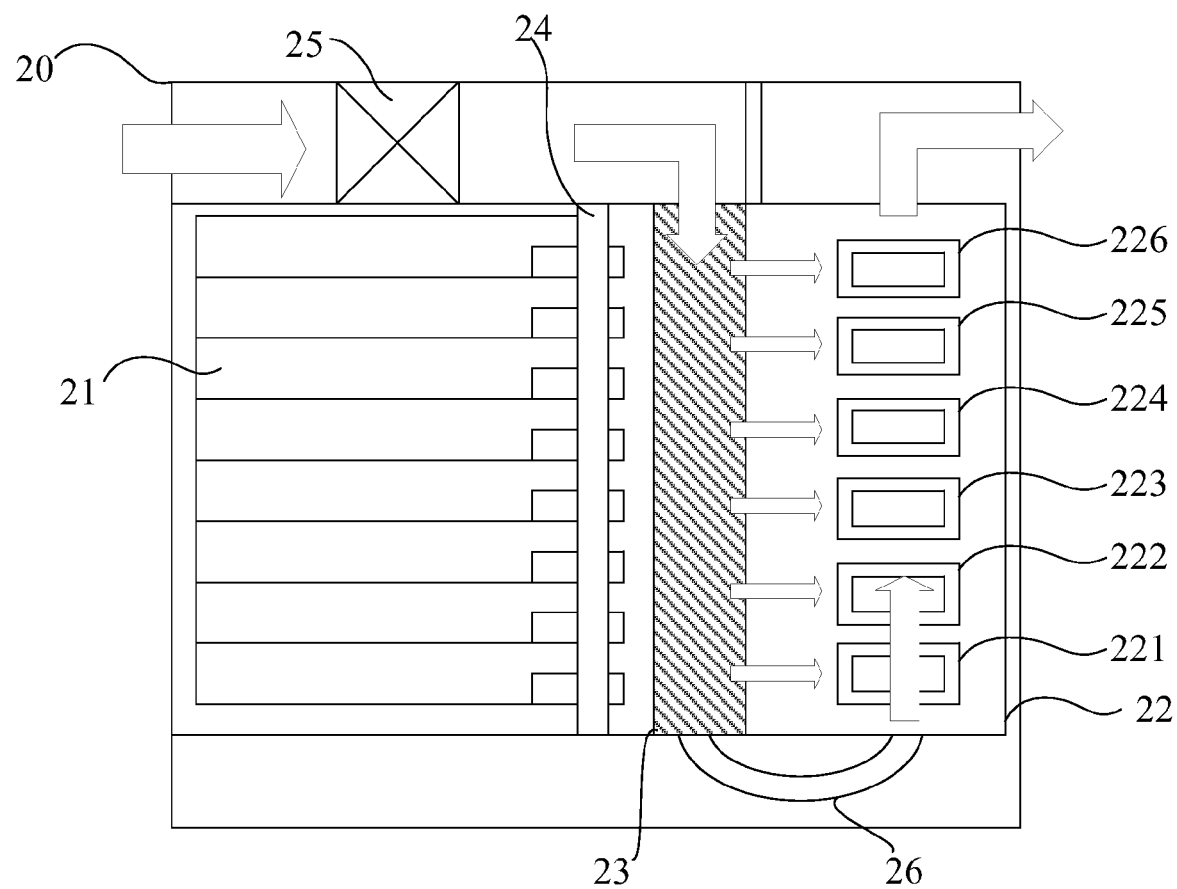
FIG. 2b is a second variant of the heat dissipation system shown in FIG. 2.

In another example, as shown in FIG. 2b, an air guide pipe 26 exists at a bottom of the air guide cavity 23 to guide a part of air inside the air guide cavity 23 to the vertically inserted board 22, so that the part of air is discharged from bottom to top along the vertically inserted board 22. With such U-shaped air duct design, an air flow from bottom to top carries an air flow that is directly blown from a side-wall hole of the air guide cavity 23 towards a heating component, which helps the air flow flows towards an upper air outlet faster. At the same time, air may also be separately supplied to a component (such as an optimal module) behind 221 to 226, thereby improving temperature concatenation and achieving a better heat dissipation effect.

With the solution in the first embodiment of the present invention, by using design of an air guide cavity, a heat dissipation system of a U-shaped structure in which air enters from a top and exits from the top is implemented, so that a lower space is saved and a 4U height is reduced in the terms of space, as compared with a conventional Z-shaped heat dissipation system. At the same time, air is separately supplied to a heating component on a rear board, thereby breaking through temperature concatenation between an upper component and a lower component and achieving a better heat dissipation effect.

Figure 3:
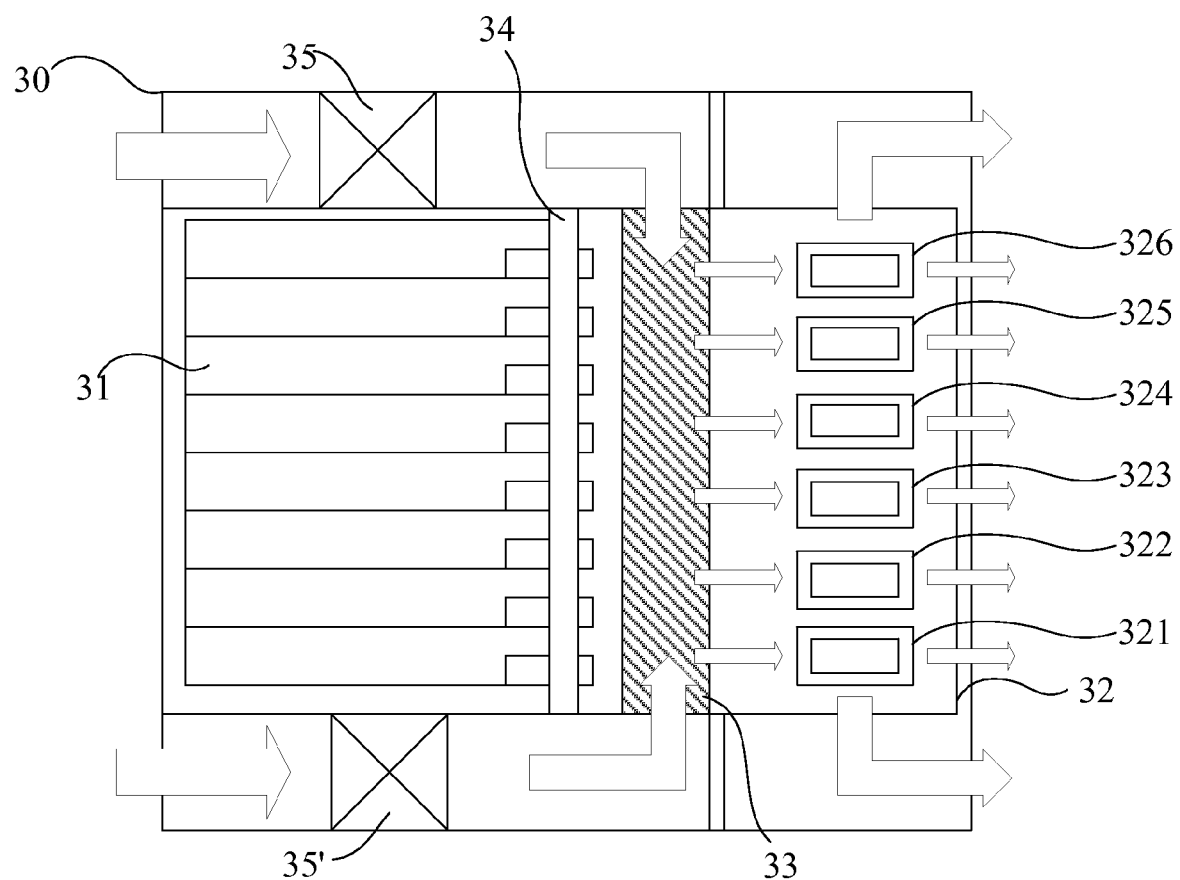
FIG. 3 is a side view of a sectional structure of a heat dissipation system with a π-shaped air duct according to a second embodiment of the present invention.

When a communications system device uses a high-power single board which imposes a higher heat dissipation requirement, an air intake area and an air discharge area may be expanded on a basis of the first embodiment, and a heat dissipation system of a π-shaped structure is used to greatly improve heat dissipation performance of the system. FIG. 3 is a side view of a sectional structure of a heat dissipation system of a π-shaped structure according to a second embodiment of the present invention. As shown in FIG. 3, the heat dissipation system in the second embodiment includes: a chassis 30, an air guide cavity 33, a first fan group 35, a second fan group 35', and an air volume management apparatus (not shown in the figure).

The air guide cavity 33 and the air volume management apparatus are exactly the same as corresponding apparatuses described in the first embodiment, which are not described herein again.

A first air intake pipe in which the first fan group 35 is installed is reserved at a front top of the chassis 30, and a second air intake pipe in which the second fan group 35' is installed is reserved at a front bottom of the chassis 30. In addition to fans, a silencing structure cavity may further be installed inside the first air intake pipe and the second air intake pipe to facilitate noise reduction design of the system. Multiple cooling holes (not shown in the figure; and reference is made to arrows shown on a rear side of the chassis) may exist on the rear side of the chassis 30. A first air discharge pipe and a second air discharge pipe are connected to the exterior of the chassis and may also be used for installing a third fan group. A horizontally inserted board 31 and a vertically inserted board 32 are disposed inside the chassis 30, and are inserted with each other through a backplane 34 or directly inserted with each other to form an orthogonal architecture.

Figure 3A:
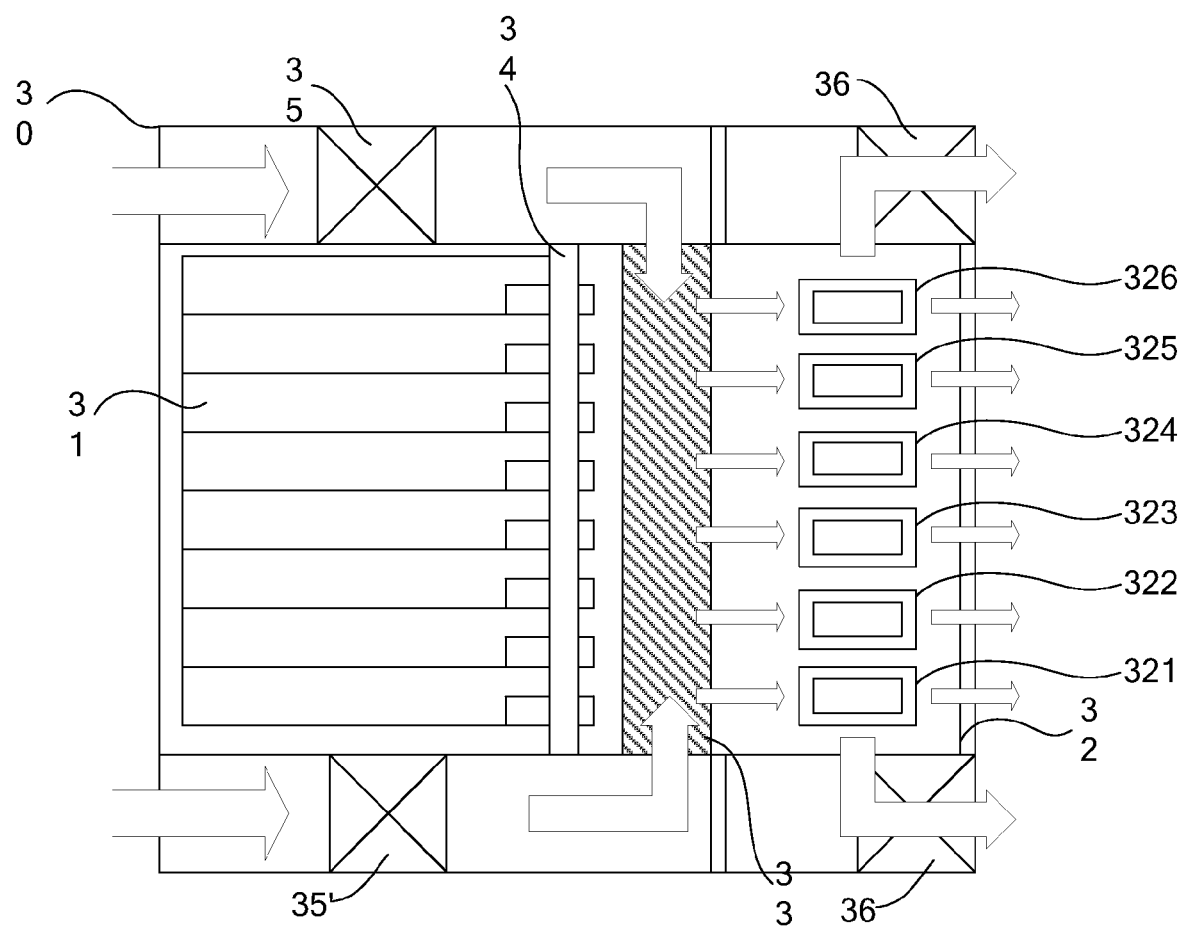
FIG. 3a is a first variant of the heat dissipation system shown in FIG. 3.

When the heat dissipation system works, air outside the chassis 30 is absorbed by the first fan group 35 and the second fan group 35' into the chassis 30, passes through the first air intake pipe and the second air intake pipe, and enters the air guide cavity 33 from an upper end and a lower end. In this case, pressure inside the air guide cavity 33 is relatively high and a pressure-equalized cavity is formed. The air is directly blown through side-wall holes of the air guide cavity 33 towards heating components 321 to 326 on the vertically inserted board 32, so that the air is separately supplied to each heating component to facilitate heat dissipation of the component. Then the air is discharged from the cooling holes (not shown in the figure) on the rear side of the chassis 30 and air ducts at a top and a bottom of the rear side of the chassis. In an example, as shown in FIG. 3a, a third fan group 36 is installed inside the first air discharge pipe and the second air discharge pipe, and is configured to help improve an air discharge volume and an air flow rate, thereby further improving a heat dissipation effect. The foregoing air duct through which a cooling air flow passes is of a lateral π-shaped structure.

With the heat dissipation system of the π-shaped structure, air is separately supplied to a heating component, thereby breaking through temperature concatenation between an upper component and a lower component; and in addition, in a case that an occupied space is the same as that of a conventional Z-shaped heat dissipation structure, both an air intake volume and an air discharge volume of the system are doubled, thereby effectively improving the heat dissipation effect.

Figure 4A:
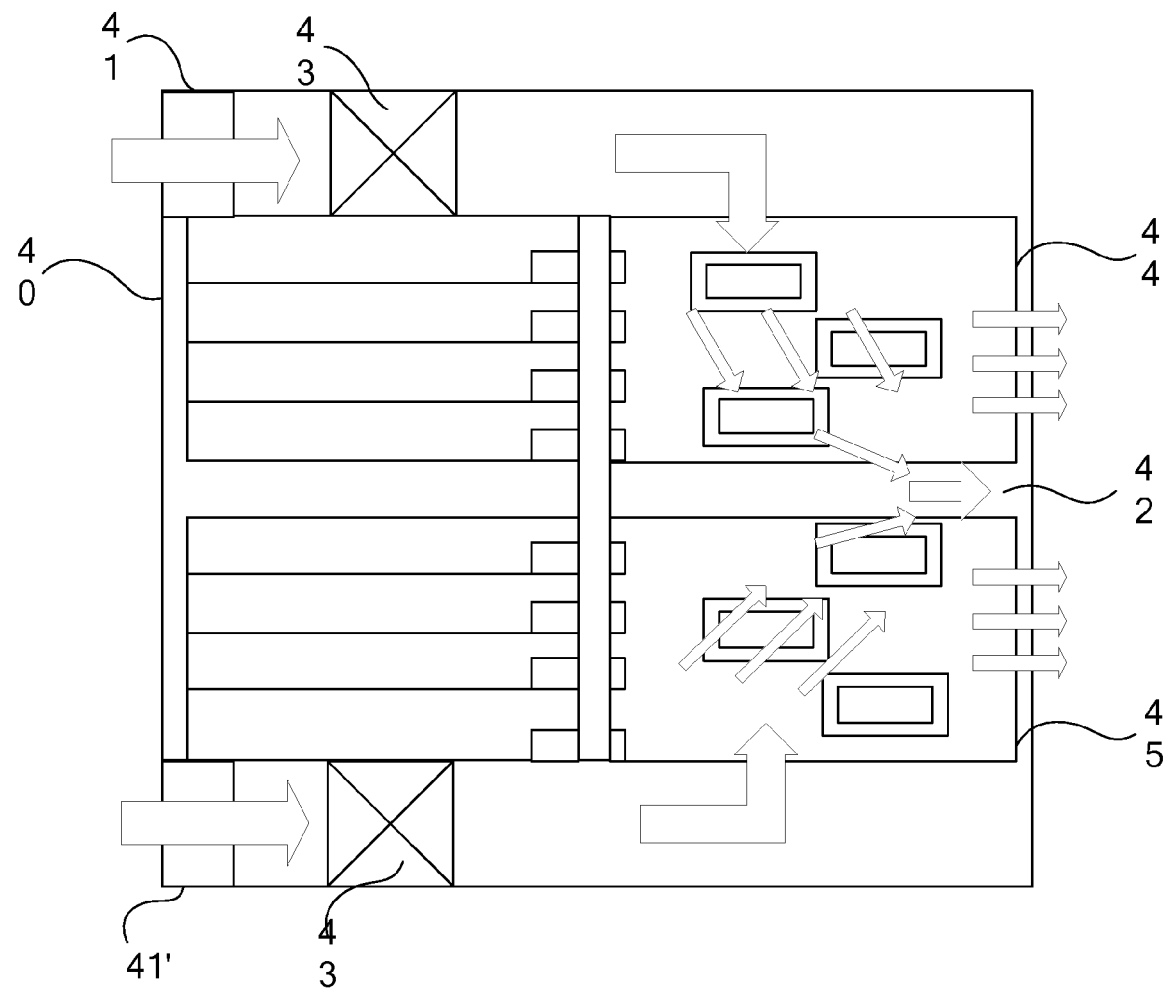
FIG. 4a is a first side view of a sectional structure of a heat dissipation system with a π-shaped air duct according to a third embodiment of the present invention.
Figure 4B:
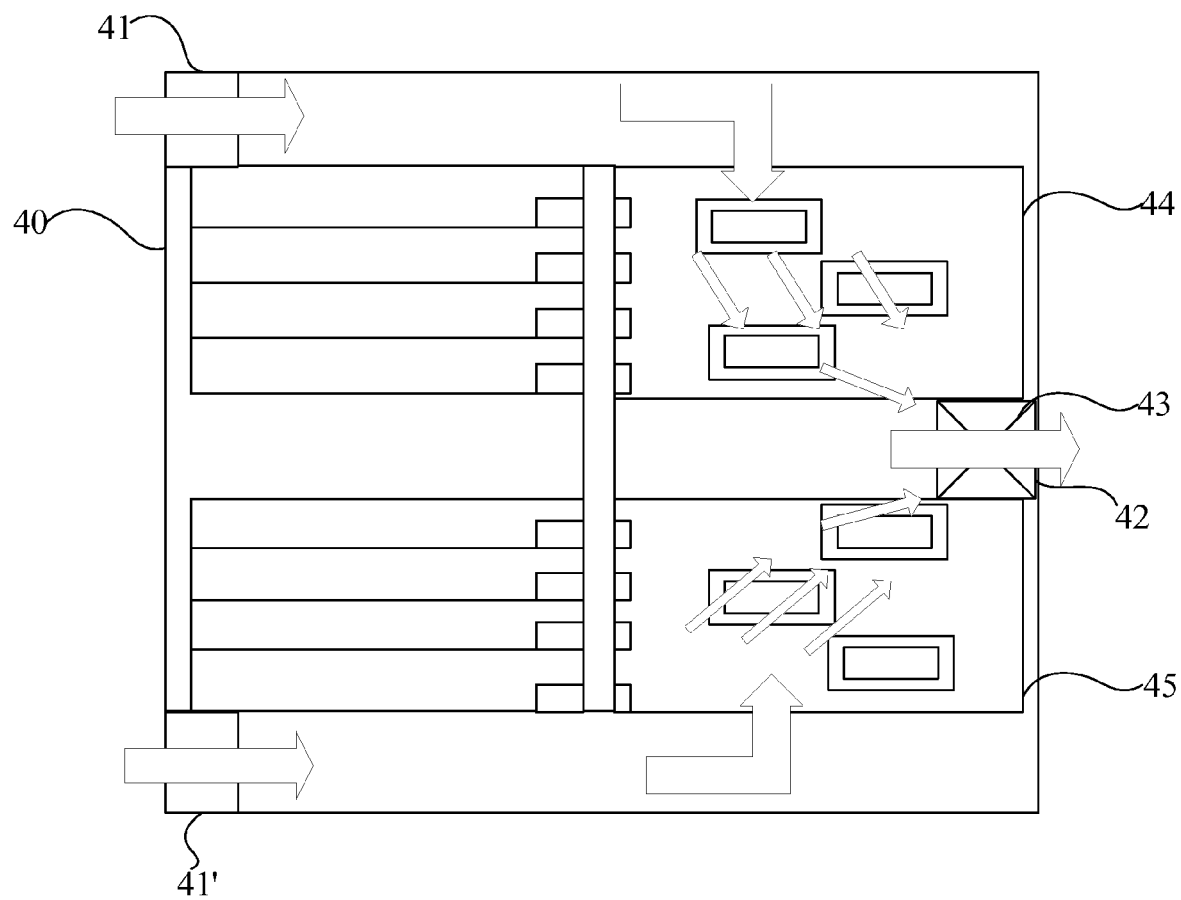
FIG. 4b is a second side view of the sectional structure of the heat dissipation system with the π-shaped air duct according to the third embodiment of the present invention.

When a communications system device uses inserted single boards that have a stacking structure, the π-shaped heat dissipation structure provided in the second embodiment may be simplified to evolve into a π-shaped heat dissipation system applicable to a stacking structure of single boards. FIG. 4a to FIG. 4b are side views of a sectional structure of a heat dissipation system with a π-shaped air duct according to a third embodiment of the present invention. As shown in the figure, the heat dissipation system in the third embodiment includes: a chassis 40, a third air intake pipe 41, a fourth air intake pipe 41', a third air discharge pipe 42, and a fan group 43.

The chassis 40 is of a rectangular structure. The third air intake pipe 41 and the fourth air intake pipe 41' are respectively reserved at a front top and at a front bottom of the chassis 40. The third air discharge pipe 42 is reserved on a rear side of the chassis 40, and is located between a first vertically inserted board 44 and a second vertically inserted board 45. In addition, multiple cooling holes may further exist on the rear side of the chassis 40.

In an example, as shown in FIG. 4a, the fan group 43 is installed inside two air intake vents 41 and 41'. When the heat dissipation system works, the fan group 43 works and drives air to flow into the chassis 40. Air entering the third air intake pipe 41 passes through the first vertically inserted board 44 to dissipate heat of a component on the first vertically inserted board 44; air entering the fourth air intake pipe 41' passes through the second vertically inserted board 45 to dissipate heat of a component on the second vertically inserted board 45; and then the air is discharged from the third air discharge pipe 42. Multiple cooling holes further exist on the rear side of the chassis 40 to facilitate heat dissipation of the chassis 40.

In another example, as shown in FIG. 4b, the fan group 43 is installed inside the third air discharge pipe 42. When the heat dissipation system works, the fan group 43 works and drives air to flow into the chassis 40. Air entering the third air intake pipe 41 passes through the first vertically inserted board 44 to dissipate heat of a component on the first vertically inserted board 44; air entering the fourth air intake pipe 41' passes through the second vertically inserted board 45 to dissipate heat of a component on the second vertically inserted board 45; and then the air is discharged outside by the fan group 43 that is disposed in the third air discharge pipe 42.

In still another example, the fan group 43 is installed inside the third air intake pipe 41, the fourth air intake pipe 41', and the third air discharge pipe 42. The fan group 43 installed inside the third air intake pipe 41 and the fan group 43 installed inside the fourth air intake pipe 41' guide external air into the chassis 40. Air entering the third air intake pipe 41 passes through the first vertically inserted board 44 to dissipate heat of a component on the first vertically inserted board 44; air entering the fourth air intake pipe 41' passes through the second vertically inserted board 45 to dissipate heat of a component on the second vertically inserted board 45; and then the air inside the chassis 40 is discharged outside by the fan group 43 that is installed inside the third air discharge pipe 42. In this way, air flowing of the heat dissipation system is enhanced and a heat dissipation effect can be further improved.

In the foregoing three examples, two groups of vertically inserted boards 44 and 45 share the same air discharge pipe 42, thereby saving a certain heat conducting space. By using heat dissipation systems of the foregoing types of π-shaped structures, air is separately supplied to each vertically inserted board in a stacking structure, thereby breaking through temperature concatenation between vertically inserted boards in a stacking structure and effectively enhancing a heat dissipation effect.

When a system has more than two stacked single boards and heat dissipation of multiple single boards is required, a solution of adding an air intake or discharge pipe and a fan on the basis of the foregoing π-shaped heat dissipation system may be used to solve a heat dissipation requirement. A case that three vertically inserted boards are stacked is taken as an example for description.

Figure 4C:
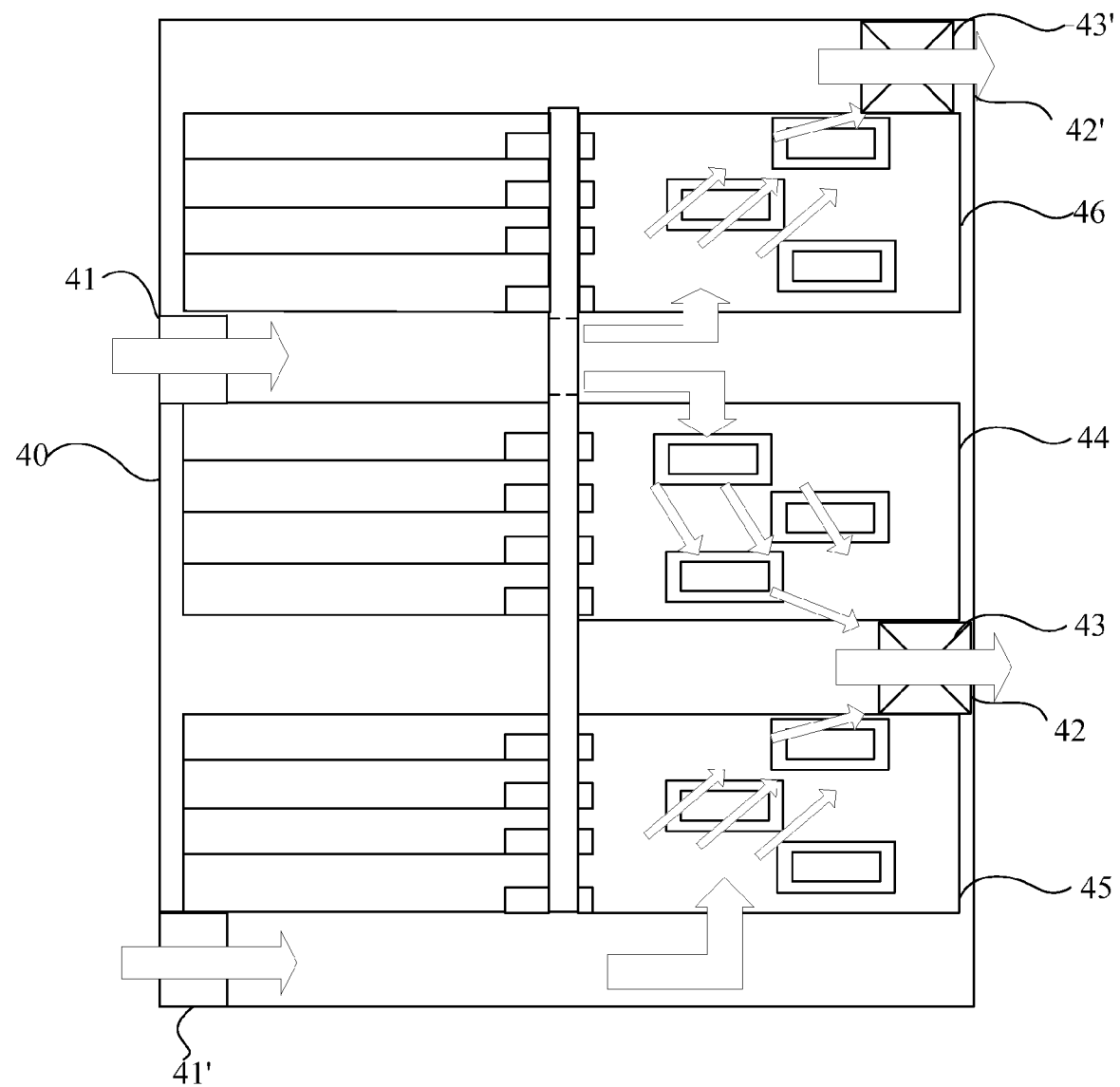
FIG. 4c is a third side view of the sectional structure of the heat dissipation system with the π-shaped air duct according to the third embodiment of the present invention.

As shown in FIG. 4c, a communications system includes a first vertically inserted board 44, a second vertically inserted board 45, and a third vertically inserted board 46, which are placed in a stacking manner.

A third air intake pipe 41 and a fourth air intake pipe 41' are respectively reserved at a front top and at a front bottom of a chassis 40. A third air discharge pipe 42 is reserved on a rear side of the chassis 40, and is located between the first vertically inserted board 44 and the second vertically inserted board 45. In addition, a fourth air discharge pipe 42' is further reserved on the rear side of the chassis 40, and is located between the first vertically inserted board 44 and the third vertically inserted board 46.

A fan group 43 is installed inside two air intake vents 41 and 41'. When a heat dissipation system works, the fan group 43 works and drives air to flow into the chassis 40. Air entering the third air intake pipe 41 is split into two parts after passing through holes on the rear side. One part flows upward to pass through the third vertically inserted board 46 to dissipate heat of a component on the third vertically inserted board 46, and then is discharged by the fourth air discharge pipe 42'; and the other part flows downward to pass through the first vertically inserted board 44 to dissipate heat of a component on the first vertically inserted board 44, and then is discharged by the third air discharge pipe 42. Air entering the fourth air intake pipe 41' passes through the second vertically inserted board 45 to dissipate heat of a component on the second vertically inserted board 45, and then is discharged by the third air discharge pipe 42.

In this way, independent heat dissipation is implemented for each vertically inserted board in three-layer stacking structure, thereby breaking through temperature concatenation between vertically inserted boards in a stacking structure and effectively enhancing a heat dissipation effect. In addition, in the foregoing example, two groups of vertically inserted boards 44 and 45 share the same air discharge pipe 42, and two groups of vertically inserted boards 44 and 46 share the same air intake pipe 41, which also saves a certain heat conducting space.

According to the heat dissipation systems of the foregoing types of π-shaped structures provided in the embodiments of the present invention, a π-shaped heat dissipation system that is applicable to an architecture of stacking more single boards and supplies air separately to each vertically inserted board may be easily expanded.

Although the embodiments of the present invention are discussed in detail by using an example that a horizontally inserted board is on a front side of a chassis and a vertically inserted board is on a rear side of the chassis, it should be noted that the present invention is also applicable to a scenario in which a vertically inserted board is on the front side and a horizontally inserted board is on the rear side.

In the foregoing specific embodiments, the objectives, technical solutions, and beneficial effects of the present invention are described in further detail. It should be understood that the foregoing descriptions are merely specific embodiments of the present invention, but are not intended to limit the protection scope of the present invention. Any modification, equivalent replacement, and improvement made within the spirit and principle of the present invention shall all fall within the protection scope of the present invention.

What is claimed is:

1. A heat dissipation system, comprising:
   a chassis configured to house single boards of an orthogonal architecture, wherein the single boards comprises a vertically inserted board;
   a first fan group installed inside a first air intake pipe in the upper front of the chassis and configured to guide air into the chassis; and
   an air guide cavity installed inside the chassis and configured to transfer the air that is guided by the first fan group into the chassis to a component on the vertically inserted board to perform heat dissipation.

2. The heat dissipation system according to claim 1, wherein the air guide cavity has a hollow columnar or terrace cavity structure.

3. The heat dissipation system according to claim 1, wherein air discharge holes exist on a side wall of the air guide cavity and are used to transfer air inside the air guide cavity to the component on the vertically inserted board.

4. The heat dissipation system according to claim 1, wherein an air guide pipe exists at a bottom of the air guide cavity and is configured to transfer air inside the air guide cavity to the component on the vertically inserted board to perform heat dissipation.

5. The heat dissipation system according to claim 1, wherein the heat dissipation system further comprises a first air discharge pipe located at a same horizontal position as the first air intake pipe and configured to discharge air that passes through the single board out of the chassis.

6. The heat dissipation system according to claim 1, wherein the heat dissipation system further comprises a second fan group installed inside a second air intake pipe in the lower front of the chassis and configured to guide air into the air guide cavity.

7. The heat dissipation system according to claim 6, wherein the heat dissipation system further comprises a second air discharge pipe located at a same horizontal position as the second air intake pipe and configured to discharge air that passes through the single board out of the chassis.

8. The heat dissipation system according to claim 5, wherein the heat dissipation system further comprises a third fan group installed inside the first air discharge pipe and/or the second air discharge pipe and configured to discharge the air out of the chassis.

9. The heat dissipation system according to claim 7, wherein the heat dissipation system further comprises a third fan group installed inside the first air discharge pipe and/or the second air discharge pipe and configured to discharge the air out of the chassis.

10. The heat dissipation system according to claim 1, wherein cooling holes exist on a rear panel of the chassis and are used to discharge hot air.

11. The heat dissipation system according to claim 1, wherein the heat dissipation system further comprises an air volume management apparatus configured to control air discharge of the air guide cavity.

12. A heat dissipation system, comprising:
   a chassis configured to house single boards of an orthogonal architecture, wherein the single boards comprises at least a first vertically inserted board and a second vertically inserted board that are stacked;
   a third air intake pipe and a fourth air intake pipe, wherein the third air intake pipe is located above the first vertically inserted board, and the fourth air intake pipe is located below the second vertically inserted board in the terms of height, so that air enters the chassis after passing through the third air intake pipe and the fourth air intake pipe;
   a third air discharge pipe disposed on a rear side of the chassis, located between the first vertically inserted board and the second vertically inserted board, and configured to discharge air inside the chassis; and
   a fan group installed inside the third air intake pipe and the fourth air intake pipe and/or the third air discharge pipe, and configured to absorb air from the third air intake pipe and the fourth air intake pipe and/or discharge air from the third air discharge pipe, wherein:
   an arrangement structure of the third air intake pipe, the fourth air intake pipe, the first vertically inserted board, and the second vertically inserted board, matched with the third air discharge pipe, enables air in the third air intake pipe and the fourth air intake pipe to respectively pass through the first vertically inserted board and the second vertically inserted board and then to be discharged by the third air discharge pipe.

13. The heat dissipation system according to claim 12, wherein cooling holes exist on a rear panel of the chassis and are used to discharge hot air.

14. The heat dissipation system according to claim 12, wherein the single boards of the chassis further comprises a third vertically inserted board that is staked above the first vertically inserted board.

15. The heat dissipation system according to claim 14, wherein the heat dissipation system further comprises a fourth air discharge pipe disposed on the rear side of the chassis, located between the first vertically inserted board and the third vertically inserted board in the terms of height, and configured to discharge the air inside the chassis.

* * * * *